United States Patent
Chih

(10) Patent No.: US 6,226,213 B1
(45) Date of Patent: May 1, 2001

(54) REFERENCE CELL ARRAY TO GENERATE THE REFERENCE CURRENT FOR SENSE AMPLIFIER

(75) Inventor: Yue-Der Chih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/494,863

(22) Filed: Jan. 31, 2000

(51) Int. Cl.$^7$ ....................................... G11C 7/02
(52) U.S. Cl. ................. 365/210; 365/185.01; 365/196; 365/185.33
(58) Field of Search .................. 365/210, 207, 365/185.33, 185.26, 185.23, 185.2, 196, 185.01

(56) References Cited

U.S. PATENT DOCUMENTS

| | | | |
|---|---|---|---|
| 5,596,527 | * 1/1997 | Tomioka et al. | 365/185.2 |
| 5,657,332 | * 8/1997 | Auclair et al. | 371/40.11 |
| 5,737,260 | * 4/1998 | Takata et al. | 365/145 |
| 5,754,475 | * 5/1998 | Bill et al. | 365/185.25 |
| 6,091,618 | * 7/2000 | Fazio et al. | 365/45 |

* cited by examiner

Primary Examiner—David Nelms
Assistant Examiner—Thong Le

(57) ABSTRACT

A novel reference cell array for normal cell reference is disclosed. The reference cell array comprises three word lines in the upper portion and three in the lower portion. Two portions are separated by a common source line. The common source line connects common sources of the middle two rows of cells to a ground potential. Each bit line has a bit line contact and an isolation region being respectively distributed at different portions and is like a black-white grid on a checkerboard to ensure the selected bit line connects only three cells. In addition, all floating gates are coupled to a potential reference to define their states and the middle four word lines are also coupled to a power source and left exterior two connected to a X__decoder to a select one. Since each reference bit line connects only 3 serial cells, a value of about ⅓ of normal cell current is naturally obtained. Because the reference cell is the same type as the normal cell it will easily trace the cell size variation and hence be easily handled.

4 Claims, 3 Drawing Sheets

REFERENCE CELL ARRAY TO GENERATE THE REFERENCE CURRENT FOR SENSE AMPLIFIER

BACKGROUND OF THE INVENTION

1. Field of the Invention

The present invention relates to a solid-state memory device in the reading operation, and more particularly to a novel reference cell array which generates a criterion reference current for doing a comparison between the normal bit line and the reference bit line by a sense amplifier. The state stored in the normal cell is hence judged.

2. Description of the Prior Art

In recent years, the development of the portable telecommunications and laptop computers has become a major driving force in the design and technology of semiconductor IC's. This growing market requires low power, high-density and electrically re-writable nonvolatile memories. Electrically erasable programmable read only memories (EEPROM) which are electrically erased on a byte-by-byte basis is one choice, however, the cell size of this type of memory is too large for application, and thus the flash memory is another choice because of its small size and high reliability. A typical prior art circuitry for reading the state stored in a flash memory is best illustrated by reference to FIG. 1.

FIG. 1 shows several functional blocks for illustrating the read operation to the memory cell. There are upper reference cell array 10, lower reference cell array 20, upper normal memory cell array 30, and lower normal memory cell array 40, as well as a sense amplifier 50. The voltage of the selected flash cell 30a in the bottom normal cell array 30 and the reference voltage of the bit line 10a in the upper reference array 10 will compare the sense amplifier 50 in the read operation. On the other hand, the voltage of the selected flash cell 40a in the upper normal cell array 40 will compare the voltage of the reference bit line 20a in the bottom reference array 20. The arrangement is to set the discharge current of the selected cell and of the reference bit line being at the same time delay.

In the reading operation, the sense amplifier 50 is precharged to a "high state" by turning on a precharge transistor (not shown). The selected word line of the memory cell and reference word line are also through a corresponding X decoder (not shown) selection so as to set them at an active state, and so does the reference bit line and the selected memory cell bit line. Thereafter, the precharge transistor is turned off to remove the precharge state of the sense amplifier 50. The cell current of the selected flash cell 40a is through a bit line in the bottom normal cell array 40 to discharge and the reference current is through a reference bit line in the upper reference array 10 to discharge. The sense amplifier 50 then compares the voltage difference between them to determine whether the data stored in the cell is logic high or logic low. As usual, the threshold current of the reference current is set to be of ½ to ⅓ of a normal cell when it is at precharge state. The "⅓" is usually a preferred value.

In the conventional method, the reference cell array consists of cells and NMOS transistors. Each reference bit line connects a cell and a NMOS transistor. For setting the reference discharge current to be of ⅓ of the normal cell, the NMOS transistor sizes are adjusted. However, it would be dangerous because of different performance behaviors of the NMOS transistor and the cell. The variation of the cell size or process will affect the reference discharge current if the size of the transistor is not adjusted again.

Thus an object of the present invention is to design a novel reference cell array so as to solve the aforementioned problems.

SUMMARY OF THE INVENTION

An object of the present invention is to provide a reference bit line voltage for a normal cell reading. The reference bit line voltage is about ⅓ of the normal cell.

A novel reference cell array for normal cell reference is disclosed. The reference cell array comprises three word lines in the upper portion and three in the lower portion. Two portions are separated by a common source line. The common source line connects common sources of the middle two rows cells to a ground potential. Each bit line has a bit line contact and an isolation region being respectively distributed at different portions and is like a black-white grid on a checkerboard to ensure the selected bit line connects only three cells. In addition, all floating gates are coupled to a potential reference to define their states and the middle four word lines are also coupled to a power source and the left exterior two connected to a X_decoder to a select one.

Since a reference bit line connects only three serial cells, a value of about ⅓ of normal cell current is naturally obtained. Still because the reference cell is the same type as the normal cell it will easily to trace the cell size variation and hence be easily handled.

BRIEF DESCRIPTION OF THE DRAWINGS

The foregoing aspects and many of the attendant advantages of the present invention will become more readily appreciated as the same becomes better understood by reference to the following detailed description, when taken in conjunction with the accompanying drawings, wherein.

DESCRIPTION OF THE PREFERRED EMBODIMENT

For controlling the reference current to be ⅓ of a normal cell, the reference discharge current generated by using a conventional reference cell array is difficult since it has to adjust the transistor size again while the cell size is changed for some reasons. However, the cell and NMOS transistor have different characteristics, as is described in the forgoing prior art.

Figure 1:
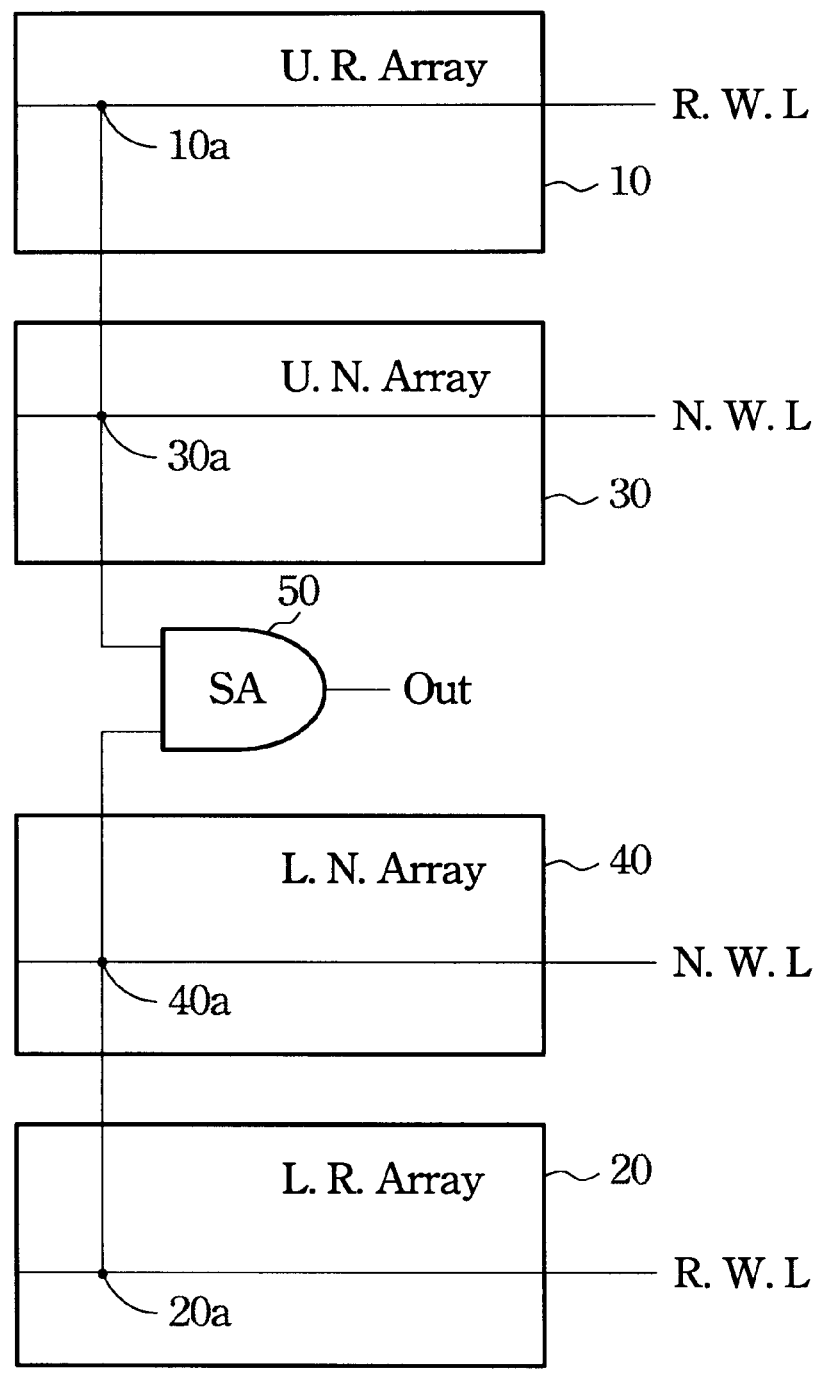
FIG. 1 shows functional blocks for illustrating the relationship between a reference cell array and a normal cell array in accordance with the prior art.
Figure 2:
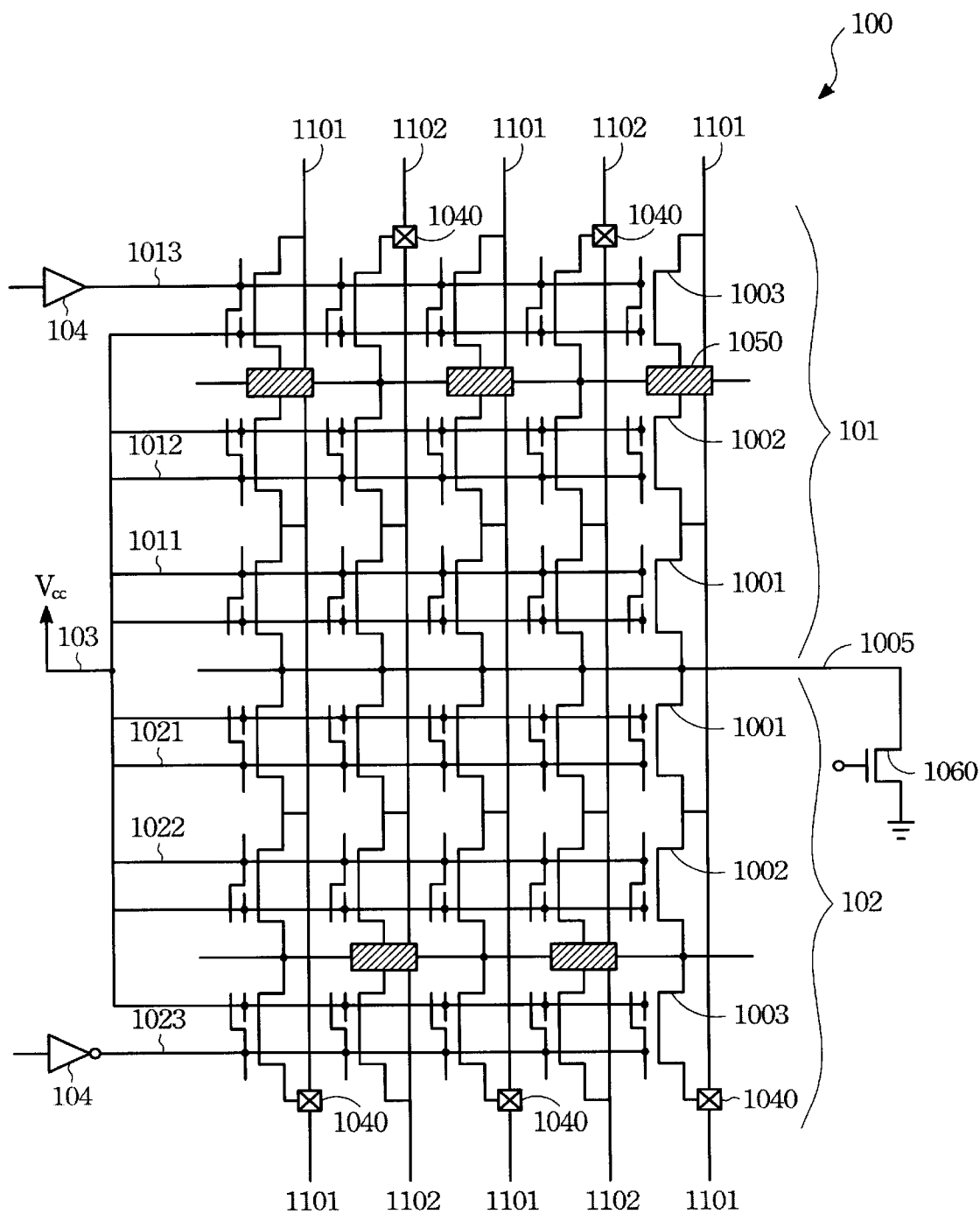
FIG. 2 shows a reference cell array in accordance with a preferred embodiment of the present invention.

Thus the present invention uses a concept that the reference cell array consists of cells only which are is the same type a normal cell. Each reference bit line connects three cells so that the reference current is naturally ⅓ of the normal cell current. The reference cell has the same behavior as the normal cell. Consequently, it is easy to trace any variation occurring in the cell size. However given, the restrictions of the design rule, the arrangement for the reference cell should be specially designed as follows:

FIG. 2 shows a reference cell 100 having a plurality of cells arranged as columns and rows by a plurality of word lines and bit lines, respectively.

Each two adjacent cells has either a common source or a common drain according to their floating gates being face to face or control gates being back to back. A common source line 1005 divides the cells into upper portion 101 and lower portion 102. For the purpose of illustrative convenience, the cells are classified into first cells 1001, second cells 1002, and third cells 1003 using the common source line 1005 as a mirror plane so that the first cells 1001, second cells 1002 and third cells 1003 demonstrate mirror symmetry. The common source line 1005 vias a transistor 1060 coupled to the ground voltage. The floating gates of all cells are connected to a power source 103 to provide a defined potential reference. Each portion has a first word line (1011,1021), a second word line (1012,1022) and a third word line (1013,1023) connecting thereto control gates of the first cells 1001, second cells 1002, and third cells 1003, respectively. Furthermore, the first word lines (1011,1021) and second word lines (1012,1022) are both connected to the power source 103. The third word lines (1013,1023) in the upper portion 101 and in the lower portion 102 are coupled to a X_decoder 104 to select either one.

Each bit line has a bit line contact 1040 and is interlaced distribution as black and white grids on a checkerboard. The bit line contact 1040 connects a drain of the third cells 1013 either at upper portion 101 or at lower portion 102. For example, with respect to the reference bit line denoted by an odd number, 1101, each has a bit line contact 1040 at lower portion 102 and with respect to the reference bit line denoted by an even number, 1102, each has a bit line contact 1040 at upper portion 101.

In addition to bit line contact 1040, each reference bit line has an isolation region 1050 to interrupt the connection of the common source line between the second cells 1002 and the third cells 1003. It also interrupts the connection between cell 1002 at the first column of the lower portion 102 (if called the column nears to X_decoder 104 as first column) and cell 1002 at the third column of the lower portion 102. The connection between cell 1002 at the second column of the upper portion 101 and cell 1002 at fourth column of the upper portion 102 is also interrupted. If a bit line contact 1040 lies at the lower portion 101, the isolation region 1050 is then at the upper portion 101. On the contrary, if a bit line contact 1040 lies at the upper portion 101, the isolation region 1050 is then at the lower portion 102. For example, the odd reference bit line, 1101, has an isolation region 1050 at the upper portion 101 and the even reference bit line, 1102, each has an isolation region 1050 at the lower portion 102. Therefor, as the X_decoder 104 selects the lower portion (e.g. the third word line 1023 is active), the odd reference bit line will be selected. By contrast, as the X_decoder 104 selects the upper portion (e.g. the third word line 1013 is active), the odd reference bit line will be selected.

Figure 3:
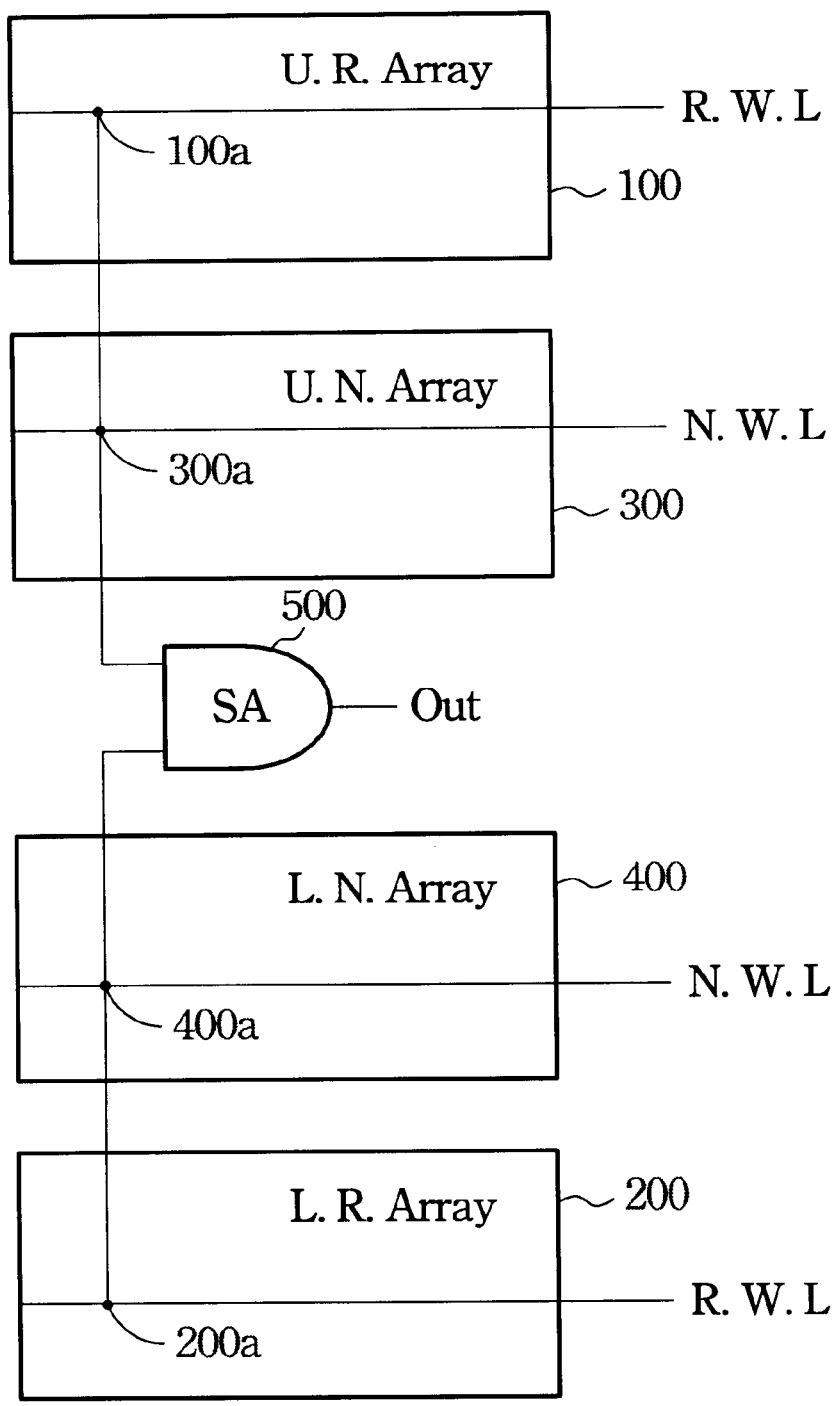
FIG. 3 shows functional blocks for illustrating the relationship between a reference cell array and normal a cell array in accordance with the present invention.

FIG. 3 shows functional blocks for illustrating the read operation in accordance with the present invention. As depicted in the prior art, the circuit comprises an upper reference cell array 100, a bottom reference cell array 200, an upper normal memory cell array 300, and a bottom normal memory cell array 400, as well as a sense amplifier 500. A selected flash cell in the upper normal cell array 300 being judged as a logic "0" or "1" is by the sense amplifier 500 to compare the voltages of a reference voltage in a bottom reference cell 200 with the selected bit line in the upper cell array 300. By contrast, a selected flash cell in the bottom normal cell array 400 is compared with the voltages of a reference voltage of a reference bit line in an upper reference cell 100. The aforementioned arrangements are necessary because the discharge current in the selected memory cell and the selected reference bit line have to be set at the same balk line otherwise the time delay generated is not the same.

The read operation begins from pre-charging of the sense amplifier 500 by turning on a precharge transistor (not shown) to a "high state." The selected word line of the memory cell and the selected reference word line are also through a corresponding X_decoder 104 to select the upper portion cells 101 or the lower portion cells 102 to active. The selected reference bit line and the selected memory cell bit line are through a Y_decoder (not shown) to select and are connected to the sense amplifier 500. Thereafter, the pre-charge transistor is turned off to remove the precharge state of the sense amplifier 500. The reference current discharge through the selected reference bit line which connects three adjacent cells and the selected normal cell current discharge through selected bit line in the normal cell to decide if the selected cell is logic "0" or logic "1" by the sense amplifier 500. As the voltage of the memory cell is larger than that of about ½–⅓ of a normal cell, logic "1" is read.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures. For example, in the aforementioned preferred embodiment, a split gate flash memory in the circuitry is depicted alone. However, as is understood by a person skilled in the art, the present reference cell used is not limited to such memory, and the circuitry can be used to read the static memory cell or the stacked gate flash memory, or any non-volatile programmable memory too.

What is claimed is:

1. A reference cell array for providing a reference voltage while reading a normal memory cell in a normal cell array comprising:

a plurality of cells classified into first cells, second cells, and third cells, using a common source line as a mirror plane divided said plurality of cells into an upper portion and a lower portion so that said first cells, second cells, and third cells of upper portion mirror symmetry with that of said lower portion, said common source line connected said first cells on said upper portion and said lower portion to a reference ground, said first cells, said second cells and said third cells of said upper portion and of said lower portion each having a respective first word line, a respective second word line and a respective third word line connecting thereto control gates thereof, said respective first word line, said respective second word line coupled to an power source, wherein said plurality of cells are flash memory and have their floating gate connected to said power source;

a plurality of reference bit lines, each of said reference bit lines having a bit line contact being interlaced as a black-white grid on a checkerboard so as to connect a drain region of one of said third cells either at said upper portion or at said lower portion, further, each of said reference bit lines having an isolation region at a common source region between one of said second cells and one of said third cells so as to interrupt connection thereof, said isolation region and said bit line contact of each of said reference bit lines being at different portion; and a first decoder connected said third word line in said upper portion and in said lower portion to select one to active.

2. The reference cell array as in claim 1, further comprising a second decoder coupled said reference bit lines and a sense amplifier to select one of said reference bit lines to active.

3. The reference cell array as in claim 1, further comprising a transistor connected between said common source line and said reference ground potential.

4. The reference cell array as in claim 1, wherein said plurality of cells are the same type as said normal memory cells.

* * * * *